United States Patent
Cummings

(10) Patent No.: US 7,022,436 B2
(45) Date of Patent: Apr. 4, 2006

(54) EMBEDDED ETCH STOP FOR PHASE SHIFT MASKS AND PLANAR PHASE SHIFT MASKS TO REDUCE TOPOGRAPHY INDUCED AND WAVE GUIDE EFFECTS

(75) Inventor: Kevin Cummings, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 10/341,385

(22) Filed: Jan. 14, 2003

(65) Prior Publication Data

US 2004/0137335 A1    Jul. 15, 2004

(51) Int. Cl.
*G01F 9/00* (2006.01)
(52) U.S. Cl. .................................................. 430/5
(58) Field of Classification Search .................. 430/5, 430/322, 323, 324
See application file for complete search history.

(56) References Cited

U.S. PATENT DOCUMENTS

| | | | |
|---|---|---|---|
| 5,536,606 A * | 7/1996 | Doan | 430/5 |
| 5,958,630 A * | 9/1999 | Hashimoto et al. | 430/5 |
| 6,284,416 B1 | 9/2001 | Shiraishi et al. | |
| 2002/0068229 A1 | 6/2002 | Westerman et al. | |
| 2002/0122991 A1 | 9/2002 | Shiota et al. | |
| 2003/0044695 A1* | 3/2003 | Rothschild et al. | 430/5 |

FOREIGN PATENT DOCUMENTS

| | | |
|---|---|---|
| JP | 6-282065 | 10/1994 |
| WO | WO 98/00758 | 1/1998 |
| WO | WO00/41222 | 7/2000 |

\* cited by examiner

*Primary Examiner*—S. Rosasco
(74) *Attorney, Agent, or Firm*—Pillsbury Winthrop Shaw Pittman, LLP

(57) ABSTRACT

Attenuating phase shift masks and alternating phase shift masks provide increased resolution of the apparatus by introducing a phase shift in the radiation transmitted between adjacent features of the pattern on the mask. A phase shift mask is provided with a layer of inorganic material that is etchable. The inorganic material layer is formed on a mask blank having a glass or quartz layer and an etch stop layer. The etch stop layer provides uniform etch depth of the pattern in the inorganic material layer as the etch stop layer is formed of a material that is not etched by the etching process. The phase shift mask may be provided with a layer of attenuating material instead of the resinous inorganic polymer layer. The features of the pattern of the phase shift mask may also be filled with an optically transparent or translucent material or with an opaque material having an index of refraction and a dielectric constant selected to reduce the boundary effect at side walls of features of the pattern. A device for use in an integrated circuit, an integrated optical system, magnetic domain memories, liquid-crystal display panels, and thin-film magnetic heads may be manufactured by exposing a radiation sensitive material on a substrate to a projection beam of radiation patterned with a phase shift mask having an etch stop layer and/or a pattern filled with optically transparent or translucent material or with an opaque material.

33 Claims, 15 Drawing Sheets

EMBEDDED ETCH STOP FOR PHASE SHIFT MASKS AND PLANAR PHASE SHIFT MASKS TO REDUCE TOPOGRAPHY INDUCED AND WAVE GUIDE EFFECTS

BACKGROUND OF THE INVENTION

1. Field of the Invention

The present invention relates to phase shift masks for lithographic projection apparatus, methods of manufacturing phase shift masks, and devices manufactured with phase shift masks according to the invention.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of apparatus. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interperted as encompassing various types of projection system, including refractive optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,769.

Alternating phase shift masks are used to increase the resolution of optical lithography systems. Alternating phase shift masks increase the resolution by introducing a 180° phase shift in the light transmitted between adjacent features on the mask.

FIG. 2 is a schematic illustration of an alternating phase shift mask 100 according to known construction. The mask 100 includes a glass or quartz layer 110 and a layer of opaque material, i.e. a hard mask 120. The hard mask 120 may be formed of, for example, chromium. The glass or quartz layer 100 includes portions which have been etched to define features 130 of the pattern. An area 140 of the glass or quartz layer 100 between the hard mask 120 defines an increased path length for the source radiation 200 and shifts the source radiation 200 passing through the area 140 between adjacent features 180° out of phase with the source radiation 200 passing through the etched portions that define the adjacent features 130. In order to produce the 180° phase shift, the features 130 are etched to a depth D equal to $0.5\lambda/(n-1)$, wherein $\lambda$ is the wavelength of the source radiation 200 and n is the index of refraction of the glass or quartz layer 110.

It is difficult to control the etch rate and time of the glass or quartz layer 110 to the depth D. Variations in the material of the glass or quartz layer 110 cause variations in the depth D across the surface of the mask 100 and control over the etch rate and time must be accurately controlled to accurately produce the depth D. Variations in the depth D throughout the mask 100 cause variations in the phase shift between adjacent features so that the phase shift between adjacent features may be, for example, 175° or 185°. The variation in phase shift between adjacent features of the mask 100 results in decreased resolution and critical dimension uniformity of the mask 100.

FIG. 3 is a schematic illustration of another alternating phase shift mask 150 of known construction. The mask 150 includes a layer 160 of quartz or glass. The mask 150 includes etched portions that define features 131, 132 of the pattern. The feature 132 has a smaller critical dimension CD than the feature 131. The mask 150 also includes a hard mask 120 and an area 145 between the etched portions 131 and 132 that shifts the source radiation 200 passing through the area 180° out of phase with the source radiation 200 passing through the features 131, 132.

The difficulty of accurately controlling the etch rate and time also makes it difficult to form fine or small pattern features adjacent larger pattern features because features of different size etch at different rates. Small features requiring higher etch rates and lower etch times are etched to the desired depth before large features requiring lower etch rates and higher etch times.

Fine or small pattern features, i.e. features having a small CD, also tend to act as tunnels or fibers for the source radiation 200. As the source radiation 200 reflects off the sidewalls 133 of the feature 132 the boundary effect between the quartz or glass of the layer 160 and air decreases the phase shift of the source radiation 200 and reduces the resolution of the mask 150. This boundary effect is more pronounced in high NA systems, in particular those systems used in immersion lithography.

The benefits of phase shifting decrease with increasing feature size. Resolution improvement for larger features may be accomplished with attenuated phase shift masks. Resolution may be improved with phase shifts, for example, of 90°. Although they provide lower resolution and process latitudes than alternating phase shift masks, attenuated phase shift masks are simpler to design and fabricate than alternating phase shift masks.

SUMMARY OF THE INVENTION

It is an aspect of the present invention to provide alternating and attenuating phase shift masks that provide improved resolution of a photolithographic projection apparatus. It is also an aspect of the present invention to provide phase shift masks that that reduce topography induced and/or wave guide effects. It is a further aspect of the present invention to provide methods of manufacturing alternating and attenuating phase shift masks that provide improved control of the phase shift across the mask while allowing for greater margins of error in the etch rate and time of a pattern to be formed on the mask. It is a still further aspect of the present invention to provide a device for use in integrated circuits, integrated optical systems, magnetic domain memories, liquid-crystal display panels, and thin-film magnetic heads manufactured by a method including endowing a projection beam of radiation using a phase shift mask according to the present invention.

This and other aspects are achieved according to the present invention in a patterning device for use in a lithographic projection apparatus, the patterning device including a glass or quartz layer; a layer of inorganic material; and an etch stop layer between the glass or quartz layer and the resinous inorganic polymer layer, wherein a pattern is formed in the resinous inorganic polymer layer and the etch stop layer is not provided between the glass or quartz layer and the resinous inorganic polymer layer in areas corresponding to the pattern.

According to a further aspect of the present invention there is provided a method of manufacturing a patterning device for use in a photolithographic projection apparatus, the method including providing a blank including a layer of glass or quartz and an etch stop layer; forming a layer of resinous inorganic polymer on the etch stop layer; forming a layer of opaque material on the resinous inorganic polymer layer; applying a layer of radiation sensitive material on the opaque material layer; exposing the radiation sensitive material layer to a patterned projection beam of radiation; removing a portion of the opaque material layer corresponding to the pattern; developing the pattern in the resinous inorganic polymer layer; and removing portions of the etch stop layer corresponding to the pattern.

According to a still further aspect of the present invention there is provided a patterning device for use in a lithographic projection apparatus, the patterning device including a glass or quartz layer; a layer of attenuating material; and an etch stop layer between the glass or quartz layer and the resinous inorganic polymer layer, wherein a pattern is formed in the resinous inorganic polymer layer and the etch stop layer is not provided between the glass or quartz layer and the resinous inorganic polymer layer in areas corresponding to the pattern and a method of manufacturing a patterning device for use in a photolithographic projection apparatus, the method including providing a blank including a layer of glass or quartz and an etch stop layer; forming a layer of attenuating material on the etch stop layer; forming a layer of opaque material on the attenuating material layer; applying a layer of radiation sensitive material on the opaque material layer; exposing the radiation sensitive material layer to a patterned projection beam of radiation; removing a portion of the opaque material layer corresponding to the pattern; developing the pattern in the attenuating material layer; and removing portions of the etch stop layer corresponding to the pattern.

According to a still further aspect of the present invention there is provided a patterning device for use in a lithographic projection apparatus, the patterning device including a layer of glass or quartz having a pattern formed therein, wherein the pattern is filled with one of an optically transparent material, an optically translucent material, and an opaque material, the material having an index of refraction and a dielectric constant different from the glass or quartz layer and a method of manufacturing a patterning device for use in a photolithographic projection apparatus, the method including providing a blank of glass or quartz; applying a layer of radiation sensitive material on the blank; exposing the radiation sensitive material layer to a patterned projection beam of radiation; developing the pattern in the blank; filling the developed pattern with one of an optically transparent material, an optically translucent material and an opaque material, the material having an index of refraction and a dielectric constant different from the glass or quartz blank; and etching the material from portions of the blank where the pattern is not formed.

According to a still further aspect of the present invention there is provided a device for use in integrated circuits, integrated optical systems, patterns for magnetic domain memories, liquid-crystal display panels, and thin-film magnetic heads, the device manufactured by a method including providing a projection beam of radiation; endowing a beam of radiation with a pattern in its cross section using a patterning device according to the present invention; and projecting the patterned beam of radiation onto a target portion of a layer of radiation sensitive material at least partially covering a substrate.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams. It should also be appreciated that the term "phase shift mask" refers to any mask having a desired or controlled phase shift, including but not limited to 90° and/or 180°.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
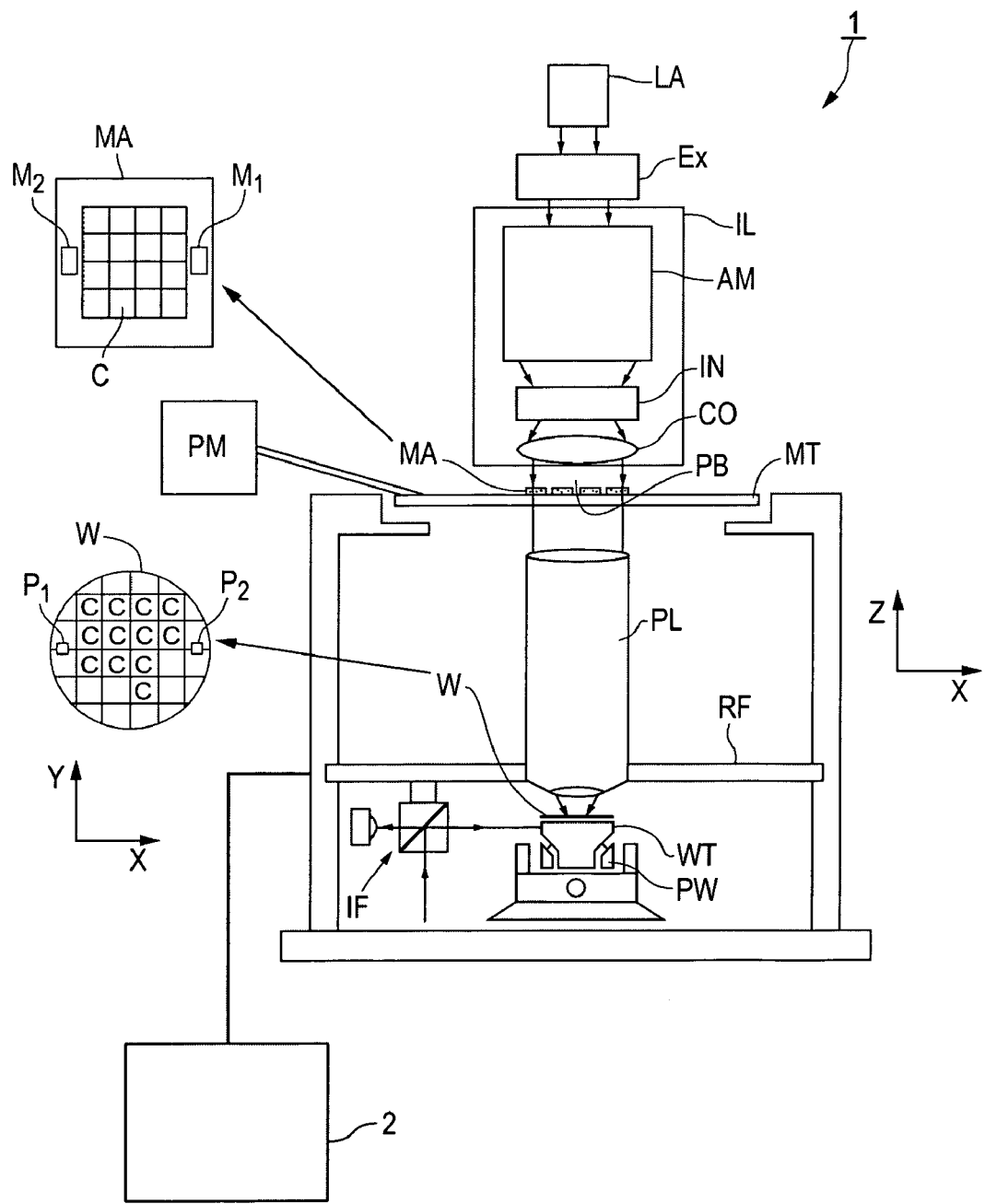
FIG. 1 is a schematic illustration of a photolithographic projection apparatus.
Figure 2:
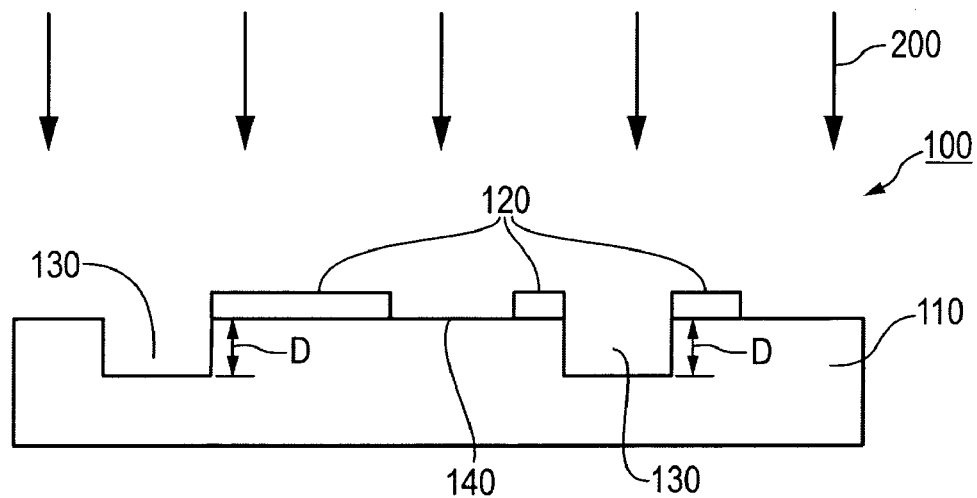
FIG. 2 is a schematic illustration of an alternating phase shift mask of known construction.

FIG. 1 schematically depicts a lithographic projection apparatus 1 according to a particular embodiment of the invention. The apparatus includes a radiation system Ex, Il, that supplies a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object table (mask table) MT provided with a mask holder for holding a mask MA (e.g. a reticle), and connected to a first positioning device PM to accurately position the mask with respect to a projection system PL; a second object table (substrate table) WT provided with a substrate holder for holding a substrate W (e.g a resist-coated silicon wafer), and connected to a second positioning device PW to accurately position the substrate with respect to the projection system PL; the projection system or lens PL. (e.g. a quartz and/or $CaF_3$ lens system or a refractive or catadioptric system, a mirror group or an array of field deflectors) constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as o-outer and o-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The current invention encompasses both of these scenarios. In particular, the current invention and claims encompass embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step-and-scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

A wafer processing apparatus 2, also referred to as a track system, may be operatively connected to the lithographic projection apparatus 1. The wafer processing apparatus 2 may include an interface section constructed and arranged to transfer wafers from cassettes to the track system, a process section including resist coating spin modules, bake modules, chill modules and resist developing spin modules, and a second interface section constructed and arranged to transfer wafers from the wafer processing apparatus 2 to the lithographic projection apparatus 1. The wafers are transported between the sections and are delivered to, processed by, removed from and transported among process modules by wafer transport mechanisms.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 4:
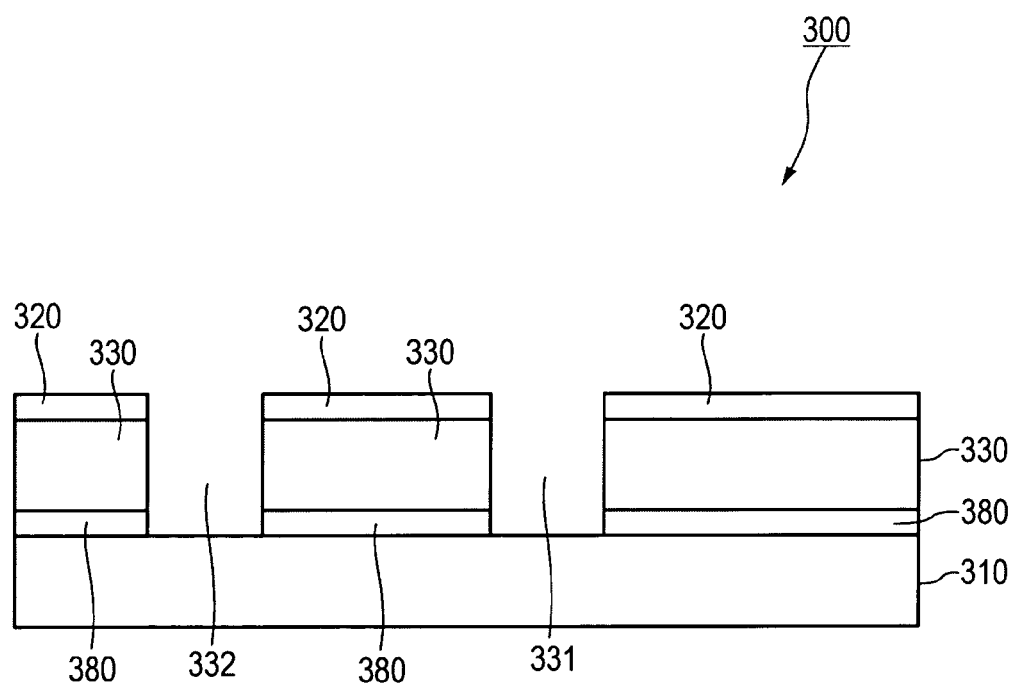
FIG. 4 is a schematic illustration of an alternating phase shift mask according to an exemplary embodiment of the present invention.

Referring to FIG. 4, an alternating phase shift mask 300 according to one embodiment of the invention includes a glass or quartz layer 310, an etch stop layer 380, a layer of inorganic material 330, and a layer of opaque material, i.e. a hard mask 320. Etched portions define features 331, 332 of the pattern. The etch stop layer 380 is formed of a material that is not removed by the type of etching chosen to produce the mask 300. For example, if the layer of resinous inorganic polymer 330 is to be dry etched, such as by a plasma tool, the etch stop 380 is made of material that is not removed by a plasma tool. As another example, if the layer of inorganic material 330 is to be wet etched, such as by acid, the etch stop 380 is made of a material that is not removed by acid. The etch stop layer 380 may be formed, for example, of chromium or other material, such as, CrN, CrC, CrO, Ta, TaN, TaNO, TaO, W (and its oxides), and Mg (and its oxides). The inorganic material layer 330 is formed of a material that is transparent and easily dissolvable or dry etchable, for example hydrogen silsesquioxane (HSQ), which is a resinous inorganic polymer. The layer 330 may be formed of other inorganic materials, such as, for example low grade fused quartz, industrial grade fused silica or "doped" grade fused silica. The hard mask 320 is a metal layer, for example chromium, or a film of another material.

Figure 5:
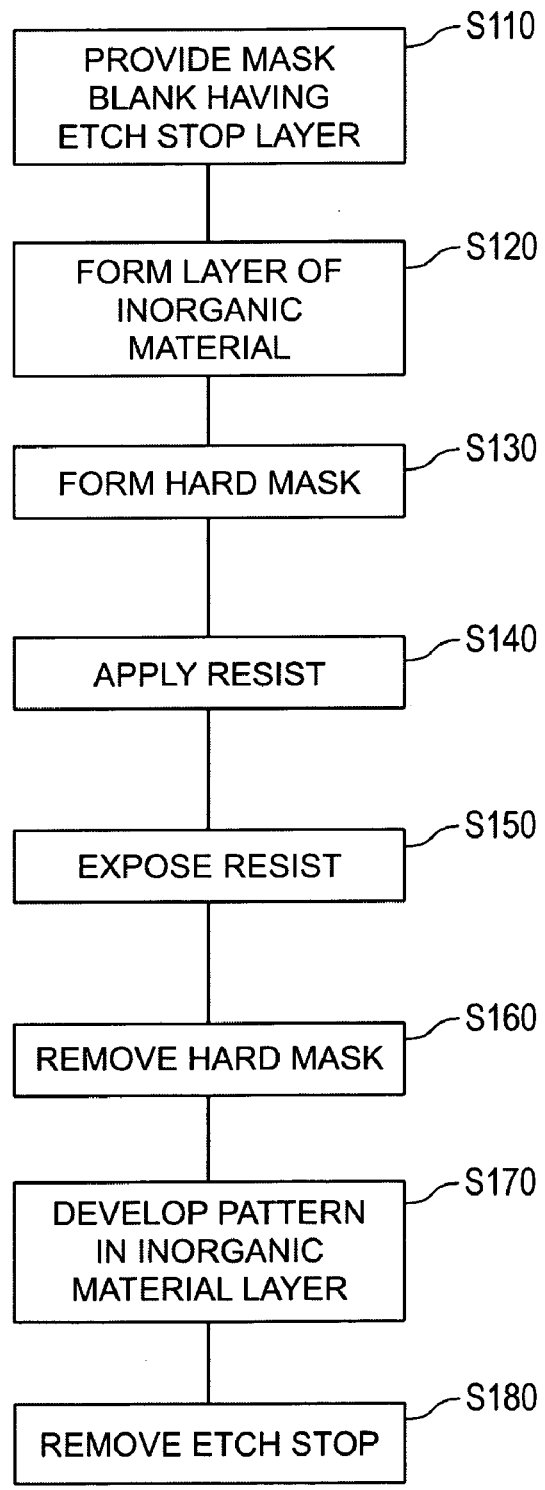
FIG. 5 is a schematic illustration of a method of manufacturing an alternating phase shift mask according to an exemplary embodiment of the present invention.

Referring to FIG. 5, a method of manufacturing an alternating phase shift mask according to the present invention includes providing a mask blank having an etch stop layer S110, forming a layer of inorganic material on the mask blank S120, forming a hard mask on the layer of inorganic material S130, applying a resist over the hard mask S140, exposing the resist S150, removing the hard mask S160, developing the pattern in the layer of inorganic material S170, and removing the etch stop S180.

Figure 6:
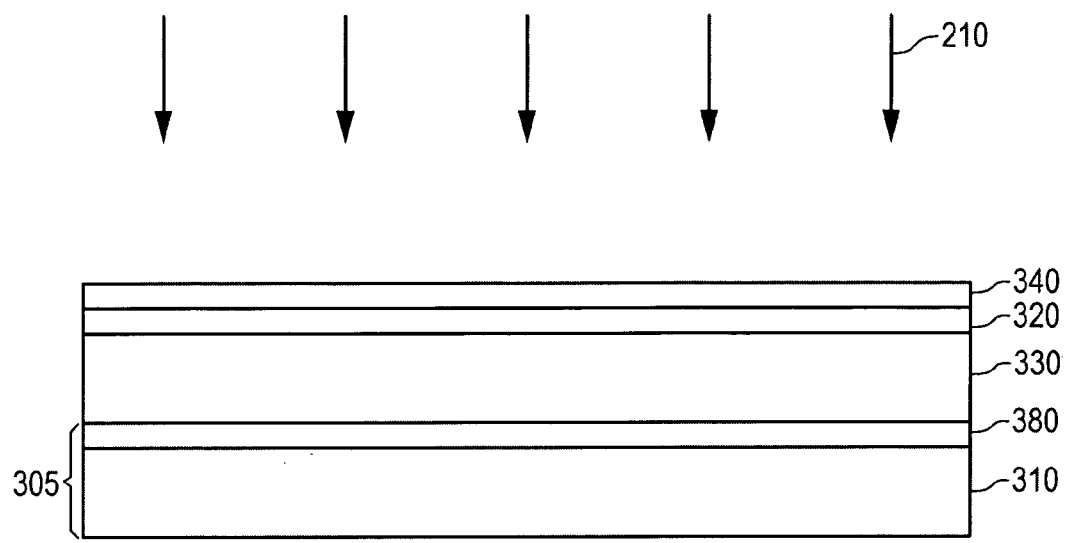
FIGS. 6–9 are schematic illustrations of an alternating phase shift mask according to the present invention during manufacture according to the method of the present invention.

Referring to FIG. 6, a mask blank 305 includes the glass or quartz layer 310 and the etch stop layer 380. The layer of inorganic material 330 is formed on the mask blank 305 by, for example, spin coating. The hard mask 320 is formed on the layer of inorganic material 330 by, for example, sputtering. The resist 340 is applied over the hard mask 320 by, for example, spin coating. The resist 340 is exposed to a patterned radiation source 210.

Figure 7:
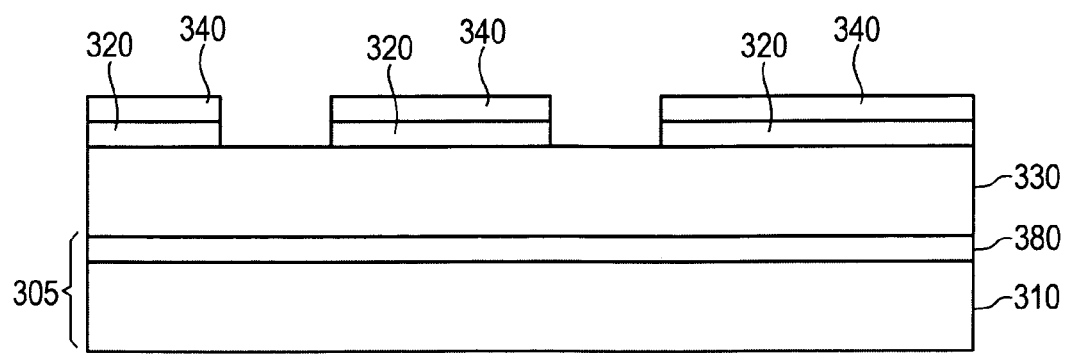

Referring to FIG. 7, the resist 340 exposed to the patterned radiation source 210 and the hard mask 320 below the exposed resist are removed. The exposed resist may be removed, for example, by a applying a solvent in which the exposed resist is soluble across the mask. The hard mask 320 may be removed by, for example, a suitable etch process, such as a wet etch or dry etch, depending on the material of the hard mask 320.

Figure 8:
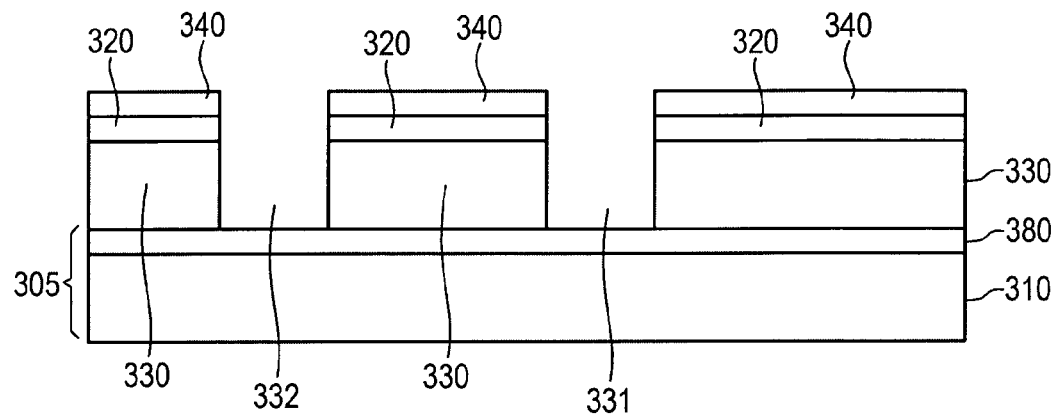

Referring to FIG. 8, a pattern is developed in the layer of inorganic material 330 by etching, either wet or dry. As the etch stop layer 380 is formed of a material that is not removed by the etching process, accurate control of the etch rate and time is not as critical as in processes used to manufacture alternating phase shift masks according to the prior art. The mask 300 may be cleaned to remove the remaining resist 340.

If over etching occurs during development of the pattern in the layer of inorganic material 330, the features of the pattern will not be etched into the glass or quartz layer 310 as the etch stop layer 380 will not be removed by the etching process and prevents etching of the glass or quartz layer 310.

Figure 9:
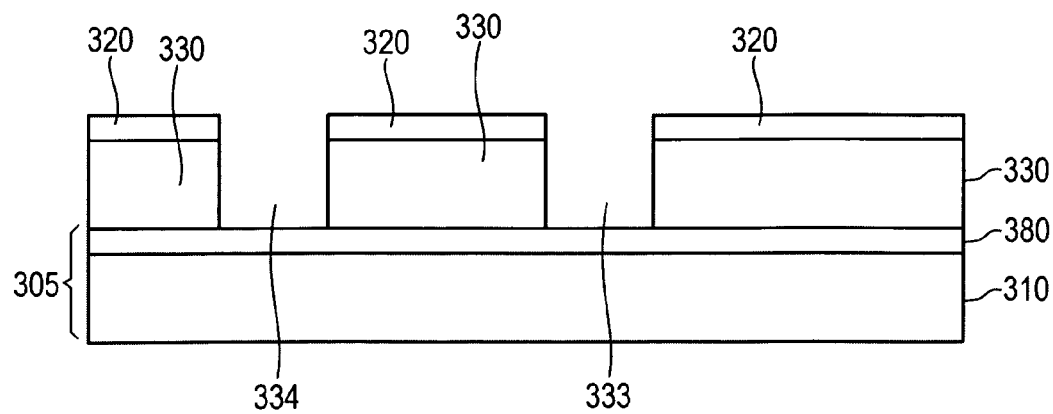

Referring to FIG. 9, the etch stop layer 380 also permits etching of smaller features 334 adjacent larger features 333. Small features, i.e., features with small critical dimensions, require higher etch rates and smaller etch times. Large features, i.e., features with large critical dimensions, require lower etch rates and higher etch times. Although the small feature 334 will be completely etched to the etch stop layer 380 before the adjacent larger feature 333 is completely etched to the etch stop layer 380, continued exposure of the completely etched small feature 334 to the etchant during completion of the etching of the large feature 333 will not cause the glass or quartz layer 310 below the small feature 334 to be etched as the etch stop layer 380 will not be etched. Upon completion of the etching of the features 333, 334, the portions of the etch stop layer 380 corresponding to the features 333, 334 of the pattern are removed to complete manufacture of the mask.

Figure 10:
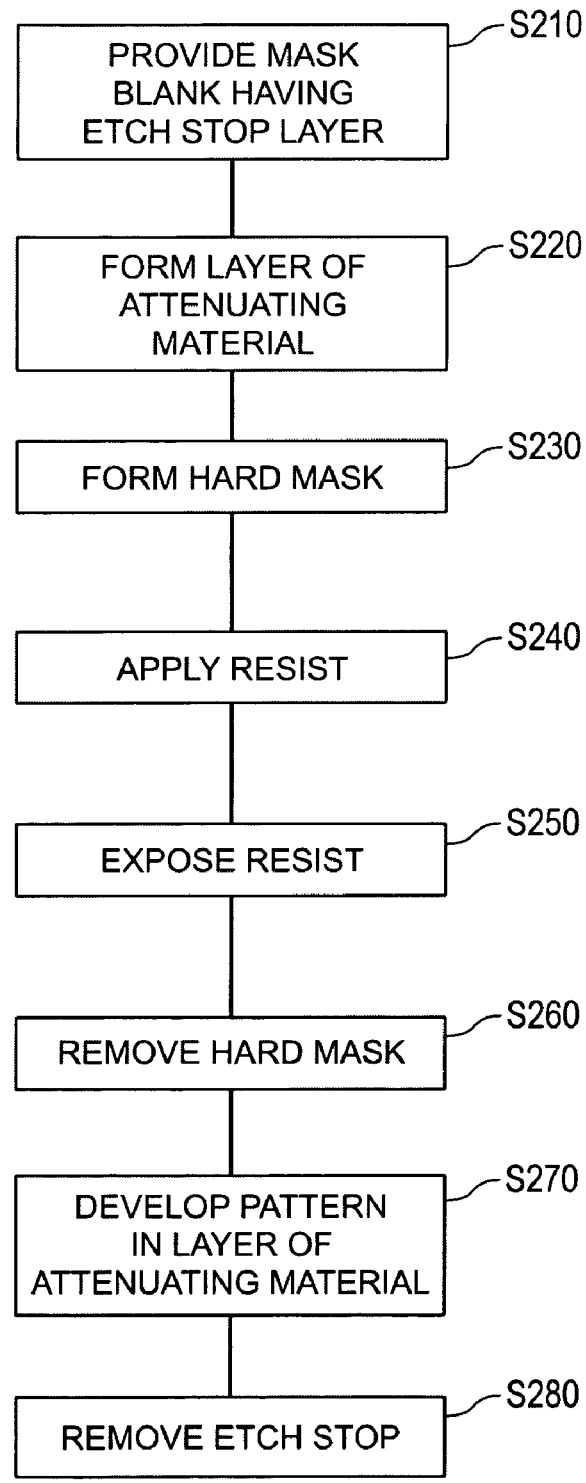
FIG. 10 is a schematic illustration of a method of making an attenuating phase shift mask according to an exemplary embodiment of the present invention.

Although the mask has been described as an alternating phase shift mask, it should be appreciated that an attenuating phase shift mask according to another exemplary embodiment of the present invention may be produced by placing a layer of attenuating material on the mask blank. Referring to FIG. 10, a method of manufacturing an attenuating phase shift mask includes providing a mask blank having an etch stop layer S210, forming a layer of attenuating material on the mask blank S220, forming a hard mask on the layer of attenuating material S230, applying a resist over the hard mask S240, exposing the resist S250, removing the hard mask S260, developing the pattern in the layer of attenuating material S270, and removing the etch stop S280.

The layer of attenuating material may be formed, for example, of molybdenum and silicon. The molybdenum and silicon may be formed on the hard mask, for example, by sputtering. It should be appreciated that any material suitable for forming an attenuating phase shift mask may be used and any method suitable for applying the attenuating material may be used to apply the attenuating layer to the mask blank.

Figure 11:
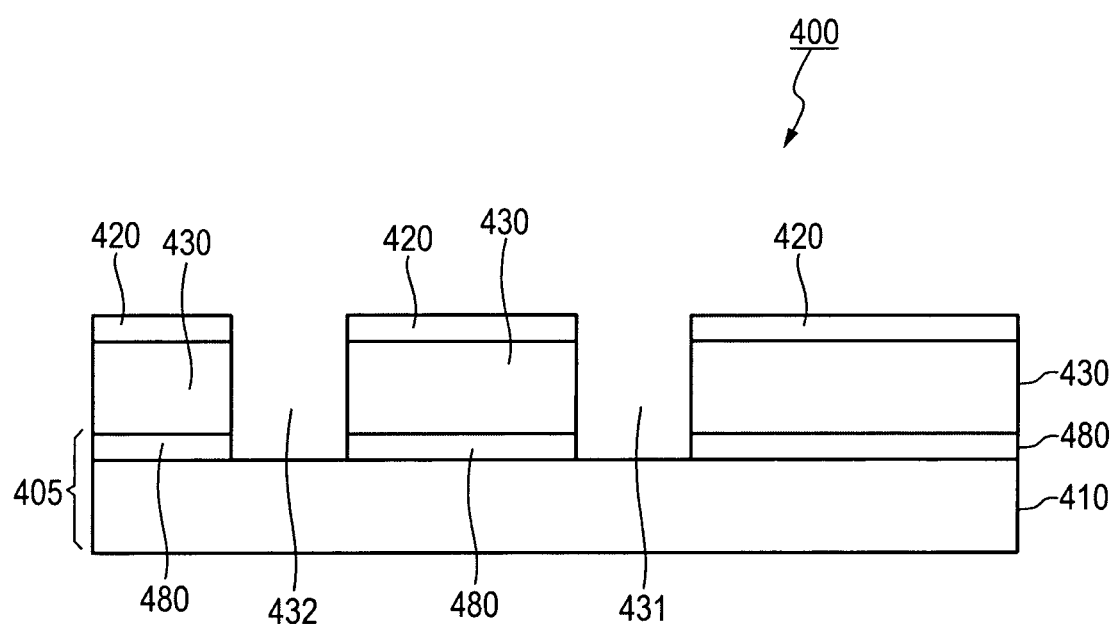
FIG. 11 is a schematic illustration of an attenuating phase shift mask according to the present invention.

Referring to FIG. 11, an attenuating phase shift mask 400 manufactured according to the present invention includes a glass or quartz layer 410, an etch stop layer 480, a layer of attenuating material 430 and a hard mask 420. The layer of attenuating material 430 is formed on the mask blank 405. Features 431 and 432 are etched into the layer of attenuating material 430. Portions of the etch stop layer 480 in the features 431 and 432 are removed after the features 431 and 432 are etched.

Figure 12:
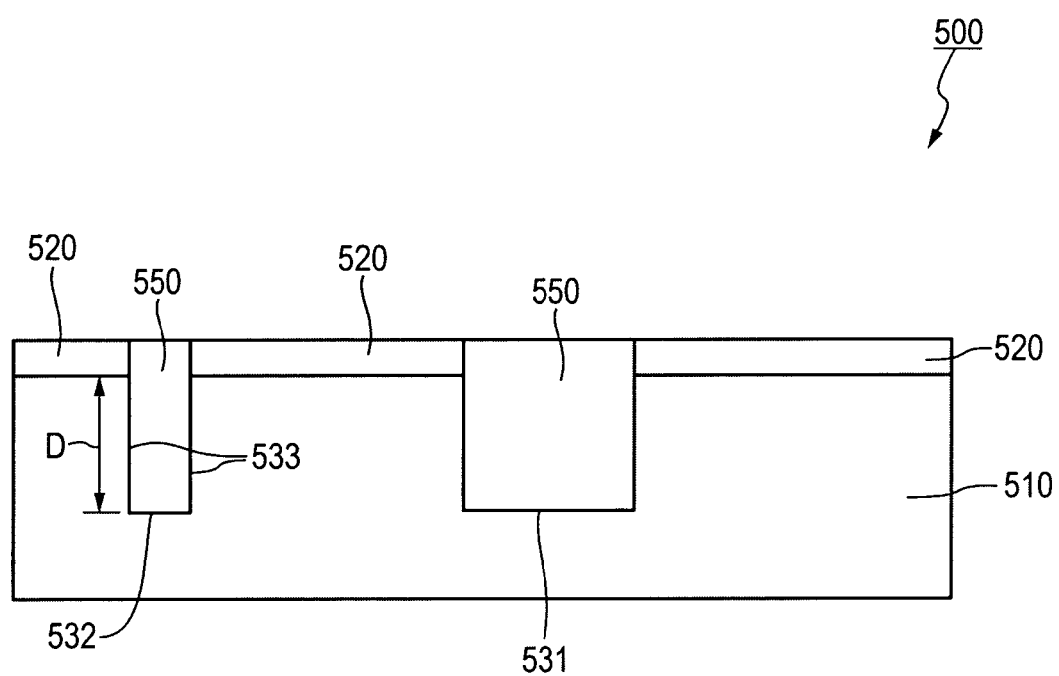
FIG. 12 is a schematic illustration of a phase shift mask according to another exemplary embodiment of the present invention.

Referring to FIG. 12, an alternating phase shift mask 500 according to another exemplary embodiment of the present invention includes a glass or quartz layer 510, a hard mask 520, formed for example of chromium, and features 531, 532 of a pattern etched into the mask 500. The feature 532 has a smaller CD than the feature 531. The features 531, 532 of the mask 500 are filled with a fill material 550. The fill material 550 may be any optically transparent or attenuating material or an opaque material.

Figure 3:
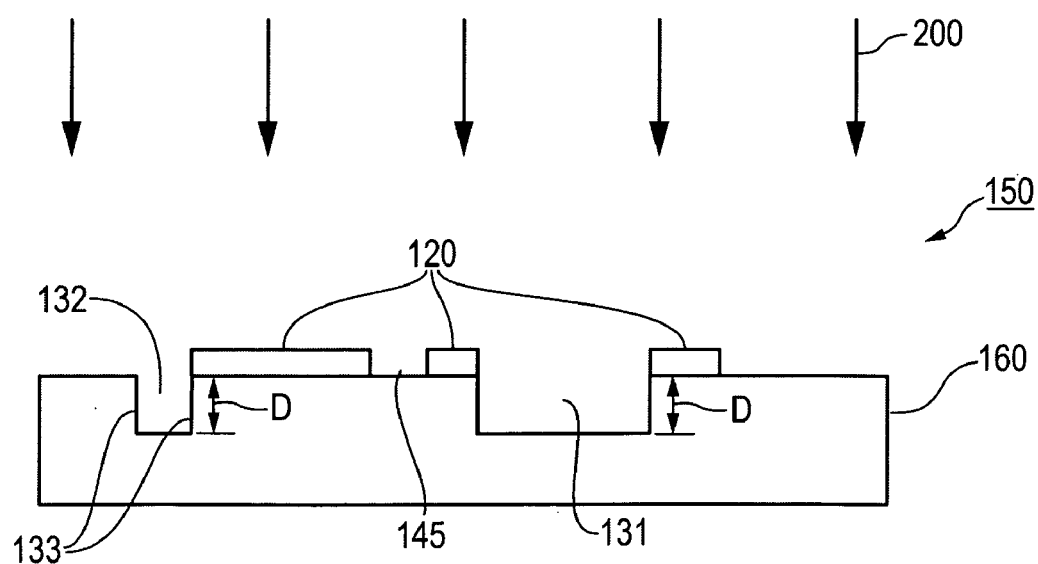
FIG. 3 is a schematic illustration of another alternating phase shift mask of known construction.

Referring again to FIG. 3, in a mask 150 of known construction, as the source radiation 200 passes through the mask 150 it impacts on sidewalls 133 of the smaller feature 132. As radiation passes through the feature 132, a portion of the radiation impacts the sidewalls 133 at various angles which may be larger than, or smaller than, Brewster's angle. Reflection of the source radiation 200 from the sidewalls 133 results in propagation irregularities that reduce the resolution of the mask 150 and a loss of control of the phase shifting properties of the mask 150.

Referring again to FIG. 12, the fill material 550 is selected to have an index of refraction $n_{550}$ and a dielectric constant $k_{550}$ different from the index of refraction $n_{510}$ and dielectric constant $k_{510}$ of the glass or quartz layer 510. The depth D that each feature 531, 532 is etched to produce the desired phase shift is inversely linearly related to the difference, $\Delta n = n_{510} - n_{550}$, between the indices of refraction of the glass or quartz layer 510 and the fill material 550, and the difference, $\Delta k = k_{510} - k_{550}$, in the dielectric constants of the glass or quartz layer 510 and the fill material 550. As the differences $\Delta n$ and $\Delta k$ increase, the depth D to which the features 531 and 532 must be etched to produce the desired phase shift decreases. Conversely, as the differences $\Delta n$ and $\Delta k$ decrease, the depth D to which the features 531, 532 must be etched to produce the desired phase shift increases. As discussed above, phase shifts of 180° degrees are desired for alternating phase shift masks and phase shifts of less than 180° are desired for attenuating phase shift masks.

Figure 13:
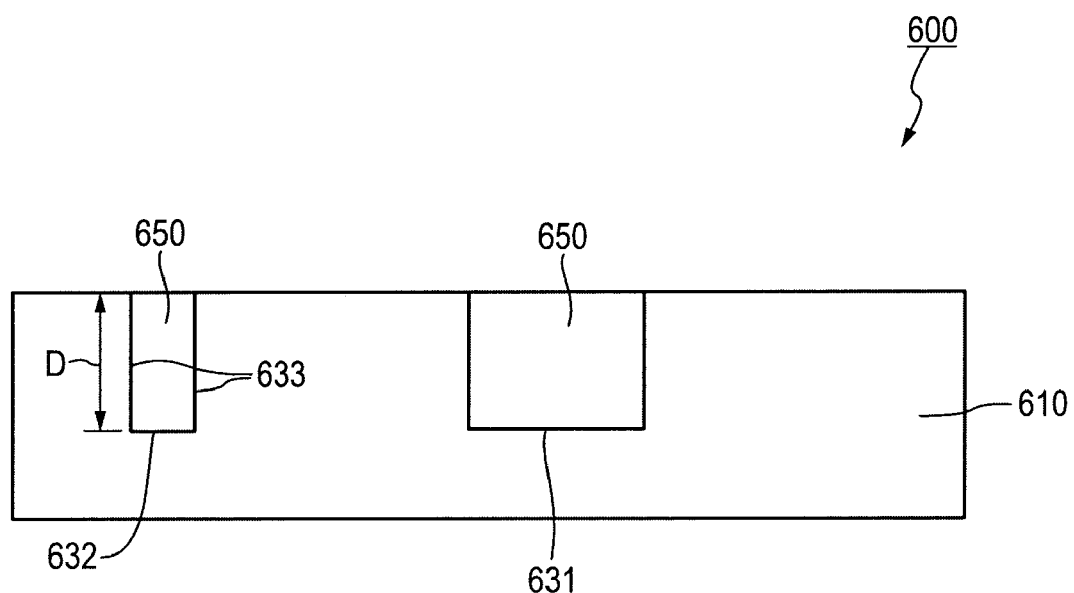
FIG. 13 is a schematic illustration of a phase shift mask according to another exemplary embodiment of the present invention.

Referring to FIG. 13, a phase shift mask 600 according to another exemplary embodiment of the present invention includes a glass or quartz layer 610, a plurality of features 631, 632 and fill material 650 in the features 631, 632.

As discussed above, the fill material may be any material having an index of refraction and a dielectric constant different from the index of refraction and the dielectric constant of the glass or quart layer of the mask. The fill material may be, for example, photoresist, glass, quartz or HSQ. The fill material may also be a material having other optical characteristics. For example, the fill material may be a material that polarizes the radiation.

Figure 14:
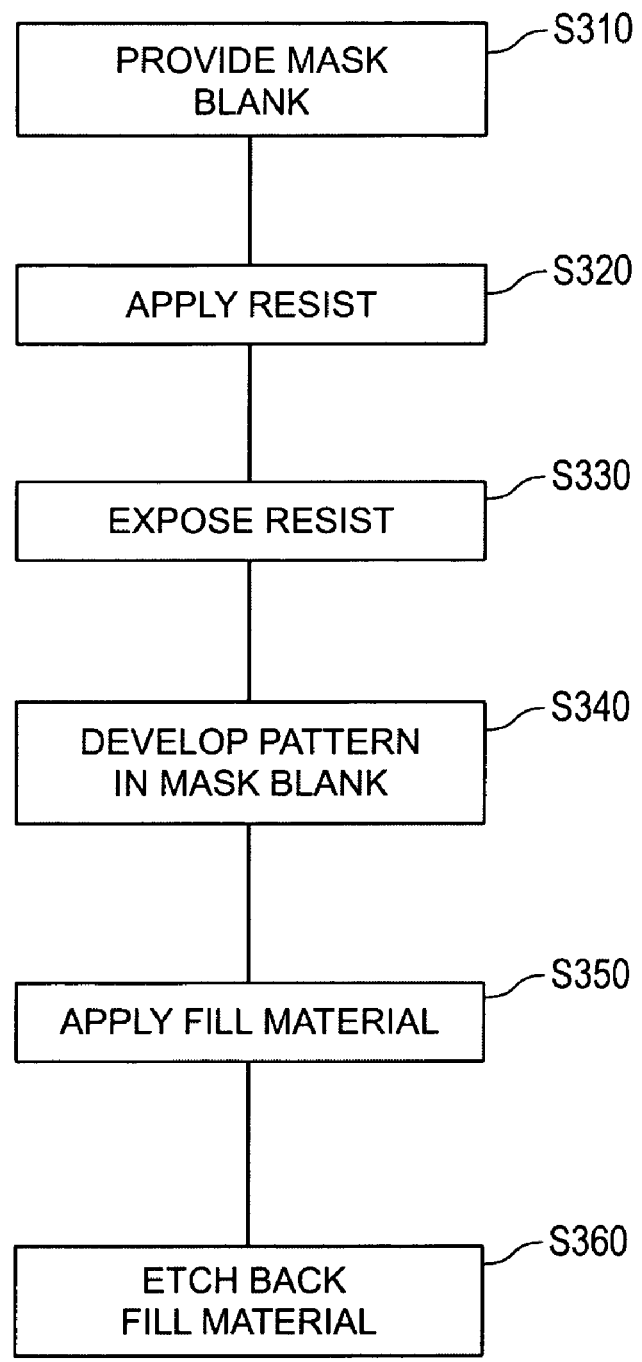
FIG. 14 is a schematic illustration of a method of manufacturing a phase shift mask according to an exemplary embodiment of the present invention.

Referring to FIG. 14, an exemplary method for manufacturing a phase shift mask according to the present invention includes providing a mask blank S310, applying a resist to the mask blank S320, exposing the resist to a source of patterned radiation S330, developing a pattern in the mask blank S340, applying a fill material to fill the features of the pattern of the mask blank S350 and etching back the fill material S360.

The fill material may be applied to the mask blank by any known process. For example, the fill material may be spin coated, sputtered, electroplated or vapor deposited on the mask.

Figure 15:
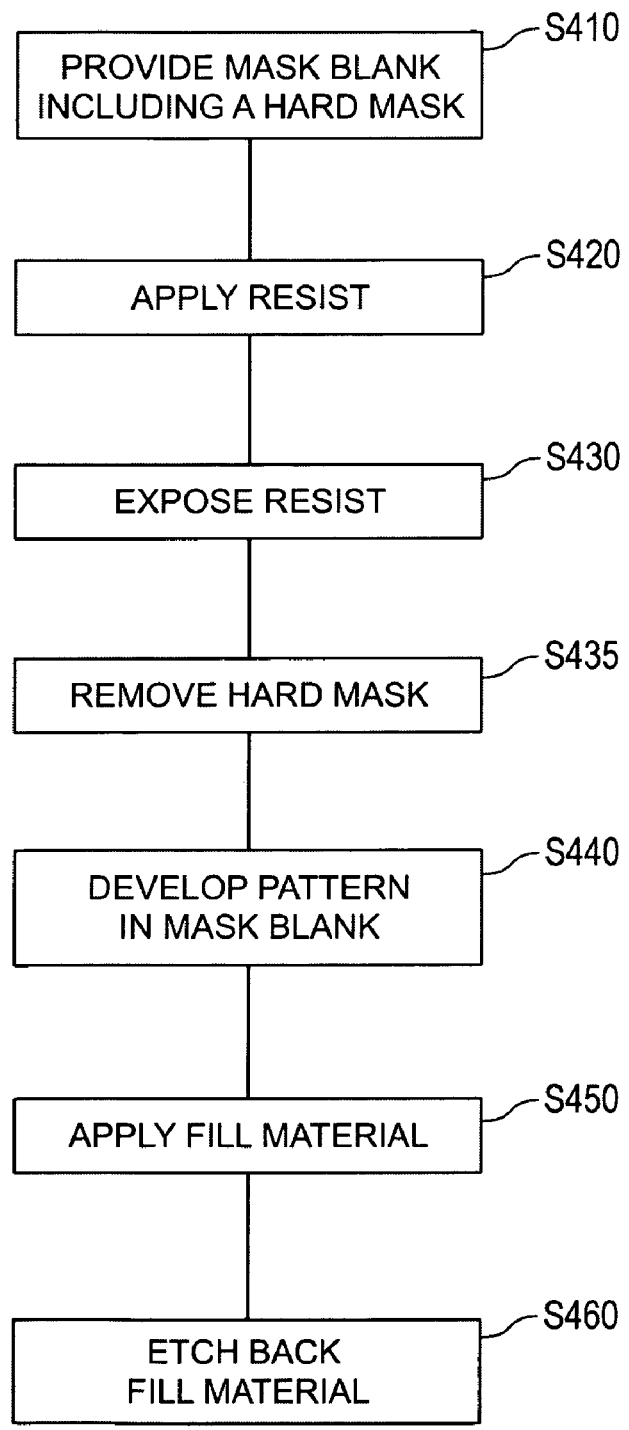
FIG. 15 is a schematic illustration of a method of manufacturing a phase shift mask according to another exemplary embodiment of the present invention.

The method illustrated in FIG. 14 may be used to manufacture the mask of FIG. 13, which does not include a hard mask. A method of manufacturing the mask of FIG. 12, which includes the hard mask 520 is schematically illustrated in FIG. 15. The method includes providing a mask blank including a hard mask S410, applying a resist to the mask blank S420, exposing the resist to a patterned source of radiation S430, removing the hard mask under the exposed resist S435, developing a pattern in the mask blank 440, applying a fill material to fill the features of the pattern of the mask blank S450 and etching back the fill material S460.

Figure 16:
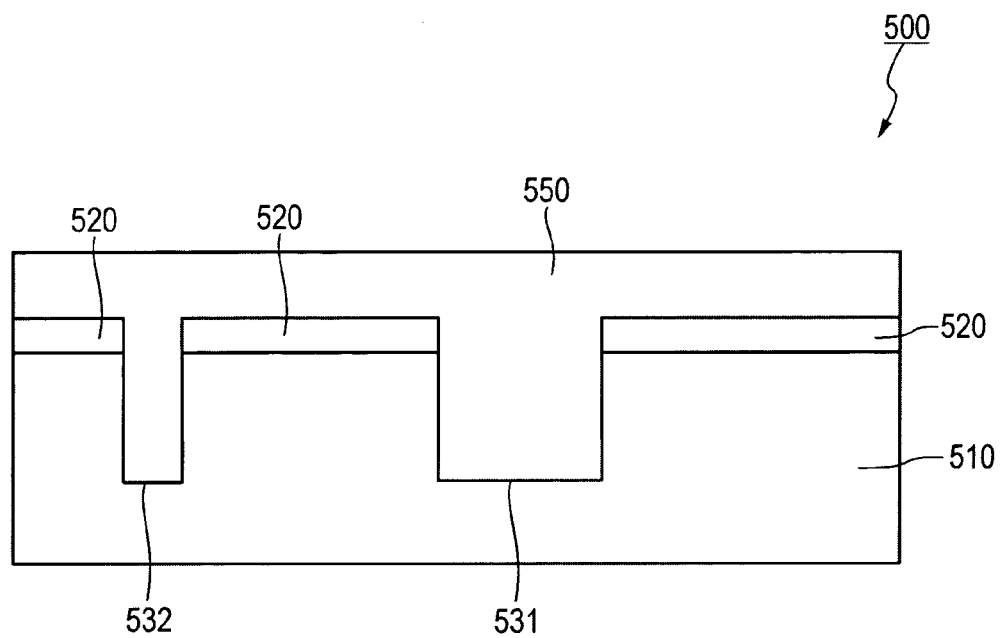
FIG. 16 is a schematic illustration of the mask of FIG. 12 after application of a fill material and prior to etching back of the fill material.
Figure 17:
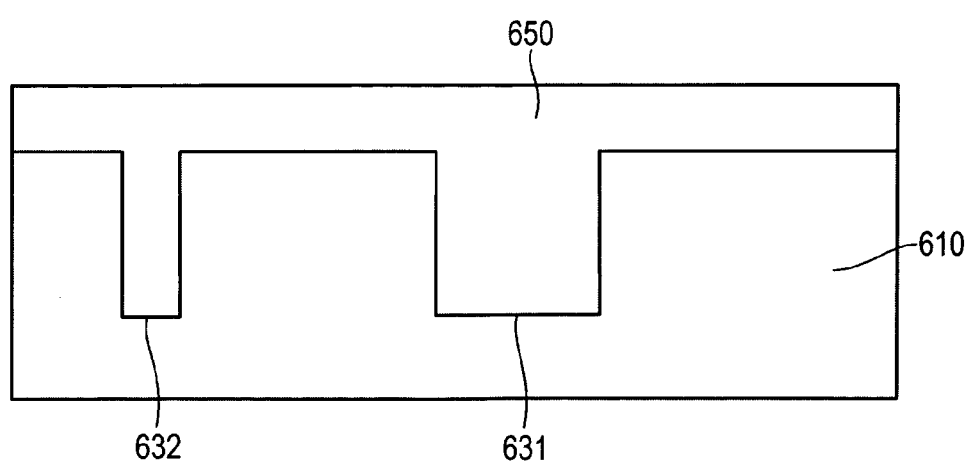
FIG. 17 is a schematic illustration of the mask of FIG. 13 after application of a fill material and prior to etching back of the fill material.

Referring to FIGS. 16 and 17, the fill material is applied to the mask to completely fill the features of the pattern and extend above the features. The fill material is then etched back to produce the masks shown in FIGS. 12 and 13, respectively. The etching back of the fill material may be done by, for example, chemical mechanical polishing (CMP). The CMP may also be used to reduce topography, i.e. flatness errors in the mask that may reduce the resolution of the mask. The hard mask 520 of the mask 500 acts as a CMP stop during polishing.

Figure 18:
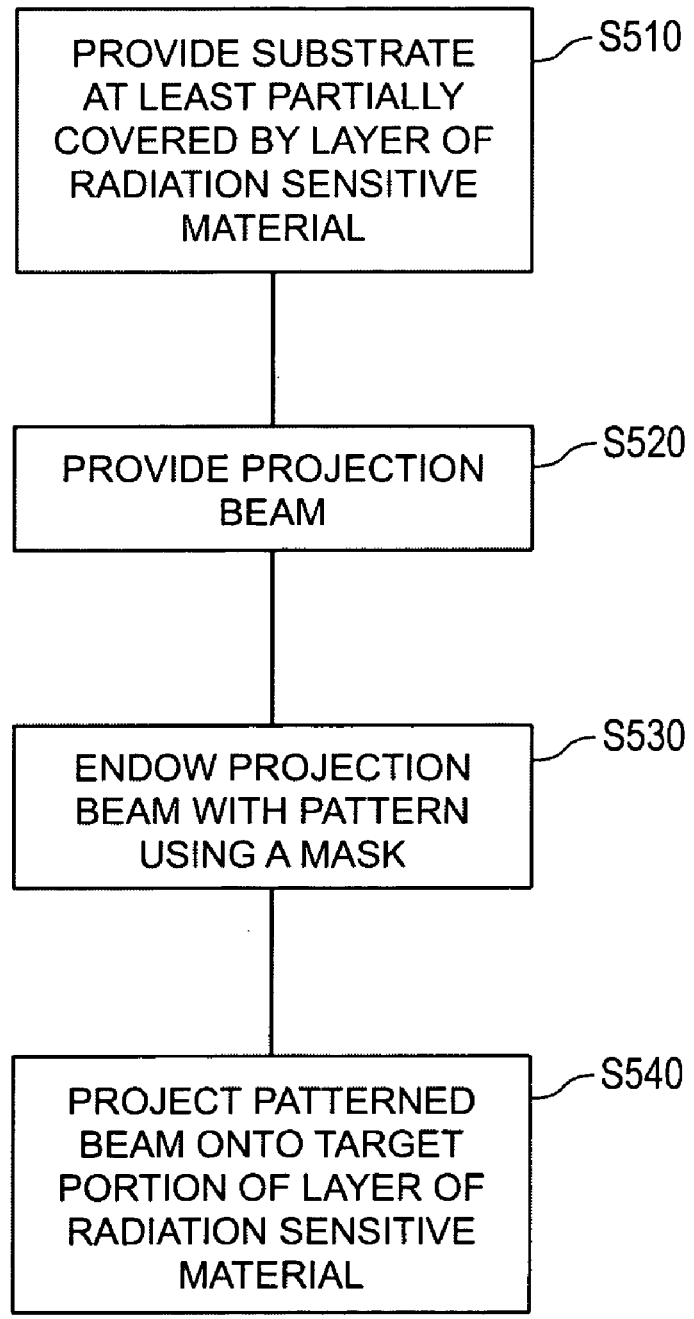
FIG. 18 is schematic illustration of a method for manufacturing a device for use in an integrated circuit, an integrated optical system, a magnetic domain memory, a liquid-crystal display panel, or a thin-film magnetic head.

Referring to FIG. 18, a method for manufacturing a device for use in an integrated circuit, an integrated optical system, a magnetic domain memory, a liquid-crystal display panel, or a thin-film magnetic head includes providing a substrate that is at least partially covered by a layer of radiation sensitive material S510, providing a projection beam of radiation using a radiation system S520, endowing the projection beam with a pattern in its cross section using a mask according to an exemplary embodiment of the present invention S530, and projecting the patterned beam of radiation onto a target portion of the layer of radiation sensitive material S540. It will be appreciated by those of ordinary skill in the art that the method of FIG. 18 may be preceded by design of the functions and performance of the device and a pattern to realize the functions. It will also be appreciated that the design and manufacture of a mask according to the present invention may also precede the method shown in FIG. 18. It will also be appreciated that substrate, or wafer, production and processing may precede the method shown in FIG. 18. The wafer processing may include, for example, oxidizing the wafer surface, forming an insulation film on the wafer surface, forming an electrode, such as by vacuum deposition, on the wafer, implanting ions into the wafer, and doping the wafer with a photosensitive agent. Other wafer processing steps that may follow the method shown in FIG. 18 include developing the resist, removing the developed resist, such as by etching, and removing unnecessary resist after etching. It will also be appreciated that device assembly and inspection, including, for example, dicing, bonding, packaging (chip sealing), and operation and durability check testing, may follow the method shown in FIG. 18.

Figure 19:
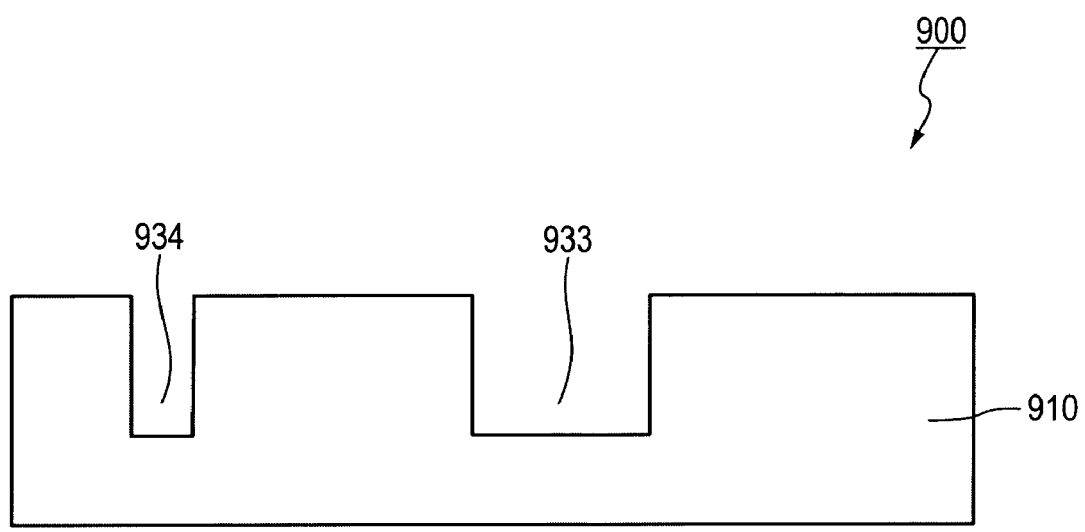
FIG. 19 is a schematic illustration of a device manufactured by a method according to the present invention.

Referring to FIG. 19, a device 900 manufactured by an exemplary method according to the present invention includes a substrate 910 having a pattern including features 933, 934 formed therein. As discussed above, it should be appreciated that the device 900 may be formed in the manufacture of integrated circuits, integrated optical systems, magnetic domain memories, liquid-crystal display panels, and thin-film magnetic heads. It should also be appreciated that the device 900 may include a plurality of patterned layers that may be formed by repeating the method or a variant thereof.

While specific embodiments of the invention have been described above, it will be appreciated that the invention may be practiced otherwise than as described. The description is not intended to limit the invention.

What is claimed is:

1. A mask for use in a lithographic projection apparatus, comprising:
   a glass or quartz layer;
   a layer of inorganic material; and
   a layer of opaque material on the inorganic material layer; and
   an etch stop layer between the glass or quartz layer and the inorganic material layer, wherein a pattern is formed in the inorganic material layer and the etch stop layer is not provided between the glass or quartz layer and the inorganic material layer in areas corresponding to the pattern and the opaque material layer is patterned corresponding to the pattern in the inorganic material layer.

2. A mask according to claim 1, wherein the inorganic material layer is formed of hydrogen silsesquioxane.

3. A mask according to claim 1, wherein the etch stop layer is formed of chromium.

4. A mask according to claim 1, wherein the opaque material layer is chromium.

5. A method of manufacturing a mask for use in a photolithographic projection apparatus, the method comprising:
   providing a blank including a layer of glass or quartz and an etch stop layer;
   forming a layer of inorganic material on the etch stop layer;
   forming a layer of opaque material on the inorganic material layer;
   applying a layer of radiation sensitive material on the opaque material layer;
   exposing the radiation sensitive material layer to a patterned projection beam of radiation;
   removing a portion of the opaque material layer corresponding to the pattern;
   developing the pattern in the inorganic material layer; and
   removing portions of the etch stop layer corresponding to the pattern.

6. A method according to claim 5, wherein the inorganic material layer is hydrogen silsesquioxane and formed by spin coating.

7. A method according to claim 5, wherein the opaque material layer is formed by sputtering.

8. A method according to claim 5, wherein the pattern is developed by wet etching.

9. A method according to claim 5, wherein the pattern is developed by etching with a plasma tool.

10. A mask for use in a lithographic projection apparatus, comprising:
    a glass or quartz layer;
    a layer of attenuating material;
    a layer of opaque material on the attenuating material layer; and
    an etch stop layer between the glass or quartz layer and the attenuating material layer, wherein a pattern is formed in the attenuating material layer and the etch stop layer is not provided between the glass or quartz layer and the attenuating material layer in areas corresponding to the pattern and the opaque material layer is patterned corresponding to the pattern in the attenuating material layer.

11. A mask according to claim 10, wherein the attenuating material layer is formed of molybdenum and silicon.

12. A mask according to claim 10, wherein the etch stop layer is formed of chromium.

13. A mask according to claim 10, wherein the opaque material layer is chromium.

14. A method of manufacturing a mask for use in a photolithographic projection apparatus, the method comprising:
   providing a blank including a layer of glass or quartz and an etch stop layer;
   forming a layer of attenuating material on the etch stop layer;
   forming a layer of opaque material on the attenuating material layer;
   applying a layer of radiation sensitive material on the opaque material layer;
   exposing the radiation sensitive material layer to a patterned projection beam of radiation;
   removing a portion of the opaque material layer corresponding to the pattern;
   developing the pattern in the attenuating material layer; and
   removing portions of the etch stop layer corresponding to the pattern.

15. A method according to claim 14, wherein the attenuating material layer is formed by sputtering.

16. A method according to claim 14, wherein the opaque material layer is formed by sputtering.

17. A method according to claim 14, wherein the pattern is developed by wet etching.

18. A method according to claim 14, wherein the pattern is developed by etching with a plasma tool.

19. A mask for use in a lithographic projection apparatus, comprising:
   a layer of glass or quartz having a pattern formed therein, wherein the pattern is filled with one of an optically transparent material, an optically translucent material, and an opaque material, the material having an index of refraction and a dielectric constant different from the glass or quartz layer.

20. A mask according to claim 19, further comprising a layer of opaque material on the glass or quartz layer, the opaque material layer having a pattern corresponding to the pattern in the glass or quartz layer.

21. A method of manufacturing a mask for use in a photolithographic projection apparatus, the method comprising:
   providing a blank of glass or quartz;
   applying a layer of radiation sensitive material on the blank;
   exposing the radiation sensitive material layer to a patterned projection beam of radiation;
   developing the pattern in the blank;
   filling the developed pattern with one of an optically transparent material, an optically translucent material and an opaque material, the material having an index of refraction and a dielectric constant different from the glass or quartz blank; and
   etching the material from portions of the blank where the pattern is not formed.

22. A method according to claim 21, further comprising providing a layer of opaque material to the glass or quartz blank prior to applying the radiation sensitive material layer.

23. A method according to claim 21, wherein etching the material includes chemical, mechanical polishing.

24. A device for use in integrated circuits, integrated optical systems, patterns for magnetic domain memories, liquid-crystal display panels, and thin-film magnetic heads, the device manufactured by a method comprising:
   endowing a beam of radiation with a pattern in its cross section using a mask according to one of claims 1, 10 and 19; and
   projecting the patterned beam of radiation onto a target portion of a layer of radiation sensitive material at least partially covering a substrate.

25. A mask for use in a lithographic projection apparatus, comprising:
   a glass or quartz layer;
   a layer of resinous polymer;
   a layer of opaque material on the resinous polymer layer; and
   an etch stop layer between the glass or quartz layer and the resinous polymer layer, wherein a pattern is formed in the resinous polymer layer and the etch stop layer is not provided between the glass or quartz layer and the resinous polymer layer in areas corresponding to the pattern and the opaque material layer is patterned corresponding to the pattern in the resinous polymer layer.

26. A mask according to claim 25, wherein the resinous polymer layer is formed of hydrogen silsesquioxane.

27. A mask according to claim 25, wherein the etch stop layer is formed of chromium.

28. A mask according to claim 25, wherein the opaque material layer is chromium.

29. A method of manufacturing a mask for use in a photolithographic projection apparatus, the method comprising:
   providing a blank including a layer of glass or quartz and an etch stop layer;
   forming a layer of resinous polymer on the etch stop layer;
   forming a layer of opaque material on the resinous polymer layer;
   applying a layer of radiation sensitive material on the opaque material layer;
   exposing the radiation sensitive material layer to a patterned projection beam of radiation;
   removing a portion of the opaque material layer corresponding to the pattern;
   developing the pattern in the resinous polymer layer; and
   removing portions of the etch stop layer corresponding to the pattern.

30. A method according to claim 29, wherein the resinous polymer layer is hydrogen silsesquioxane and formed by spin coating.

31. A method according to claim 29, wherein the opaque material layer is formed by sputtering.

32. A method according to claim 29, wherein the pattern is developed by wet etching.

33. A method according to claim 29, wherein the pattern is developed by etching with a plasma tool.

* * * * *